(12) United States Patent
Kishimoto

(10) Patent No.: US 12,261,585 B2
(45) Date of Patent: Mar. 25, 2025

(54) ELASTIC WAVE DEVICE AND METHOD FOR MANUFACTURING THE SAME

(71) Applicant: Murata Manufacturing Co., Ltd., Nagaokakyo (JP)

(72) Inventor: Yutaka Kishimoto, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 829 days.

(21) Appl. No.: 17/503,415

(22) Filed: Oct. 18, 2021

(65) Prior Publication Data

US 2022/0038073 A1 Feb. 3, 2022

Related U.S. Application Data

(63) Continuation-in-part of application No. 15/679,324, filed on Aug. 17, 2017, now Pat. No. 11,152,914, which is a continuation of application No. PCT/JP2016/057411, filed on Mar. 9, 2016.

(30) Foreign Application Priority Data

Mar. 16, 2015 (JP) .................. 2015-051816

(51) Int. Cl.
*H03H 9/17* (2006.01)
*H03H 9/13* (2006.01)

(52) U.S. Cl.
CPC .............. *H03H 9/17* (2013.01); *H03H 9/13* (2013.01)

(58) Field of Classification Search
CPC .................... H03H 9/17; H03H 9/13
See application file for complete search history.

(56) References Cited

U.S. PATENT DOCUMENTS

| | | | | |
|---|---|---|---|---|
| 2014/0117815 A1* | 5/2014 | Bi | .............. | H03H 3/04 310/346 |
| 2014/0152146 A1* | 6/2014 | Kimura | .............. | H10N 30/8542 29/25.35 |
| 2017/0366160 A1* | 12/2017 | Kishimoto | ......... | H03H 9/02842 |
| 2017/0366163 A1* | 12/2017 | Kishimoto | ............. | H03H 9/145 |
| 2017/0373663 A1* | 12/2017 | Kishimoto | ......... | H03H 9/02228 |
| 2018/0316333 A1* | 11/2018 | Nakamura | ............... | H03H 9/54 |

OTHER PUBLICATIONS

Kishimoto, "Elastic Wave Device and Method for Manufacturing the Same", U.S. Appl. No. 15/679,324, filed Aug. 17, 2017.

* cited by examiner

*Primary Examiner* — Bryan P Gordon
(74) *Attorney, Agent, or Firm* — Keating & Bennett, LLP

(57) ABSTRACT

An elastic wave device includes a piezoelectric layer including a first main surface and a second main surface facing the first main surface, an acoustically reflective layer stacked on the first main surface of the piezoelectric layer, an excitation electrode disposed on the piezoelectric layer, and a support layer. The acoustically reflective layer overlaps at least the excitation electrode in a plan view of the piezoelectric layer from the side of the second main surface. The support layer surrounds the acoustically reflective layer in a plan view of the piezoelectric layer from the side of the second main surface.

16 Claims, 12 Drawing Sheets

ELASTIC WAVE DEVICE AND METHOD FOR MANUFACTURING THE SAME

CROSS REFERENCE TO RELATED APPLICATIONS

This application claims the benefit of priority to Japanese Patent Application No. 2015-051816 filed on Mar. 16, 2015 and is a Continuation Application of PCT Application No. PCT/JP2016/057411 filed on Mar. 9, 2016. The entire contents of each application are hereby incorporated herein by reference.

BACKGROUND OF THE INVENTION

1. Field of the Invention

The present invention relates to an elastic wave device and a method for manufacturing an elastic wave device.

2. Description of the Related Art

Conventionally, elastic wave devices are widely used for, for example, cellular phones. International Publication No. 2012/086441 discloses an elastic wave device that uses Lamb waves. In the elastic wave device, an acoustically reflective layer is formed between a piezoelectric layer and a support substrate. The acoustically reflective layer includes low-acoustic-impedance layers and high-acoustic-impedance layers that are stacked.

In an elastic wave device disclosed in Japanese Patent No. 5046961, a reflective layer including low-acoustic-impedance layers and high-acoustic-impedance layers is stacked on a piezoelectric layer.

However, in some cases of the elastic wave devices disclosed in International Publication No. 2012/086441 and Japanese Patent No. 5046961, the piezoelectric layer and the low-acoustic-impedance layers are separated from each other when individual elastic wave devices are cut with a dicing machine. In some cases, one of the low-acoustic-impedance layers and the corresponding high-acoustic-impedance layer are separated from each other during cutting with a dicing machine.

SUMMARY OF THE INVENTION

Preferred embodiments of the present invention provide elastic wave devices including layers that are unlikely to be separated from each other during a process of cutting with a dicing machine, and methods for manufacturing the elastic wave device.

An elastic wave device according to a preferred embodiment of the present invention includes a piezoelectric layer including a first main surface and a second main surface facing the first main surface, an acoustically reflective layer stacked on the first main surface of the piezoelectric layer, an excitation electrode disposed on the piezoelectric layer, and a support layer. The acoustically reflective layer overlaps at least the excitation electrode in a plan view of the piezoelectric layer from a second main surface side. The support layer is structured at least so as to surround the acoustically reflective layer in a plan view of the piezoelectric layer from the second main surface side.

In an elastic wave device according to a preferred embodiment of the present invention, the support layer surrounds the piezoelectric layer in a plan view of the piezoelectric layer from the second main surface side. In this case, the piezoelectric layer and the acoustically reflective layer are much less likely to be separated from each other during a process of cutting with a dicing machine.

In an elastic wave device according to a preferred embodiment of the present invention, the acoustically reflective layer preferably includes a plurality of acoustic impedance layers, and the plurality of acoustic impedance layers include at least one low-acoustic-impedance layer and at least one high-acoustic-impedance layer with an acoustic impedance higher than an acoustic impedance of the at least one low-acoustic-impedance layer. In this case, elastic waves that propagate from the piezoelectric layer to the acoustically reflective layer are able to be reflected from an interface between the at least one low-acoustic-impedance layer and the at least one high-acoustic-impedance layer. Accordingly, the energy of the elastic waves is able to be effectively confined. In addition, the at least one low-acoustic-impedance layer and a high-acoustic-impedance layer are much less likely to be separated from each other during cutting with a dicing machine in manufacturing processes.

In an elastic wave device according to a preferred embodiment of the present invention, a gap is preferably provided outside at least one of the plurality of acoustic impedance layers. In this case, unnecessary elastic waves are canceled and able to be reduced or prevented in a manner in which the unnecessary elastic waves are diffusely reflected by the gap. Accordingly, the energy of the elastic waves in a main mode is able to be effectively confined on the piezoelectric layer side.

In an elastic wave device according to a preferred embodiment of the present invention, the at least one low-acoustic-impedance layer or the at least one high-acoustic-impedance layer preferably corresponds to a portion of the support layer. In this case, the types of materials are able to be decreased.

In an elastic wave device according to a preferred embodiment of the present invention, the at least one low-acoustic-impedance layer or the at least one high-acoustic-impedance layer outside which the gap is provided is preferably a metal layer. In this case, the gap is able to be provided with certainty.

In an elastic wave device according to a preferred embodiment of the present invention, the gaps are preferably provided outside at least two of the plurality of acoustic impedance layers that are adjacent to each other in a stacking direction. In this case, the energy of the elastic waves is able to be more effectively confined on the piezoelectric layer side.

In an elastic wave device according to a preferred embodiment of the present invention, the support layer preferably includes a cavity with a bottom portion, and the acoustically reflective layer is in contact with the bottom portion. In this case, the strength of the elastic wave device is able to be increased.

In an elastic wave device according to a preferred embodiment of the present invention, the excitation electrode is preferably an interdigital transducer electrode, and the interdigital transducer electrode is disposed on the second main surface of the piezoelectric layer. In this case, the elastic wave device that uses Lamb waves is provided.

In an elastic wave device according to a preferred embodiment of the present invention, the excitation electrode preferably includes first and second excitation electrodes, the first excitation electrode is disposed on the first main surface of the piezoelectric layer, and the second excitation electrode is disposed on the second main surface. In this case, the elastic wave device that uses bulk waves is provided.

In an elastic wave device according to a preferred embodiment of the present invention, the elastic wave device preferably further includes a reinforcing substrate disposed on the support layer opposite to the piezoelectric layer. In this case, the strength of the elastic wave device is able to be increased.

In an elastic wave device according to a preferred embodiment of the present invention, the acoustically reflective layer or at least one of the plurality of acoustic impedance layers is preferably made of a silicon oxide. In this case, the energy of the elastic waves in the main mode is able to be effectively confined on the piezoelectric layer side.

A method for manufacturing an elastic wave device according to a preferred embodiment the present invention includes a step of stacking an acoustically reflective layer on a first main surface of a motherboard that includes the first main surface and a second main surface facing the first main surface and that is made of a piezoelectric layer, a step of performing patterning on the acoustically reflective layer to divide the acoustically reflective layer into a plurality of acoustically reflective layers, a step of forming a support layer on the first main surface of the motherboard and the plurality of acoustically reflective layers, a step of disposing a plurality of excitation electrodes on the motherboard, and a step of cutting the support layer with a dicing machine to obtain a divided individual elastic wave device. The step of forming the support layer includes forming the support layer such that the support layer surrounds the plurality of acoustically reflective layers in a plan view of the piezoelectric layer from a second main surface side. The step of stacking the acoustically reflective layer includes forming the acoustically reflective layer at a position at which the acoustically reflective layer overlaps at least the plurality of excitation electrodes in a plan view of the piezoelectric layer from the second main surface side. In this case, separation of the acoustically reflective layer is unlikely to occur during cutting with a dicing machine.

In a method for manufacturing the elastic wave device according to a preferred embodiment of the present invention, the step of stacking the acoustically reflective layer on the motherboard preferably includes stacking a plurality of acoustic impedance layers. The plurality of acoustic impedance layers include at least one low-acoustic-impedance layer and at least one high-acoustic-impedance layer with an acoustic impedance higher than an acoustic impedance of the at least one low-acoustic-impedance layer. The step of stacking the acoustically reflective layer and the step of performing patterning on the acoustically reflective layer include performing patterning on the at least one low-acoustic-impedance layer or the at least one high-acoustic-impedance layer, and subsequently stacking another acoustic impedance layer such that the other acoustic impedance layer covers the at least one low-acoustic-impedance layer or the at least one high-acoustic-impedance layer on which patterning is performed to form a gap outside the at least one low-acoustic-impedance layer or the at least one high-acoustic-impedance layer on which patterning is performed. In this case, the energy of the elastic waves is able to be effectively confined on the piezoelectric layer side.

Various preferred embodiments of the present invention are able to provide elastic wave devices including layers that are unlikely to be separated from each other during a process of cutting with a dicing machine, and methods for manufacturing the elastic wave device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will hereinafter be described in detail with reference to the drawings to clarify the present invention.

The preferred embodiments are described as examples in the present specification, and features thereof may be partially replaced or combined between different preferred embodiments.

Figure 1A:
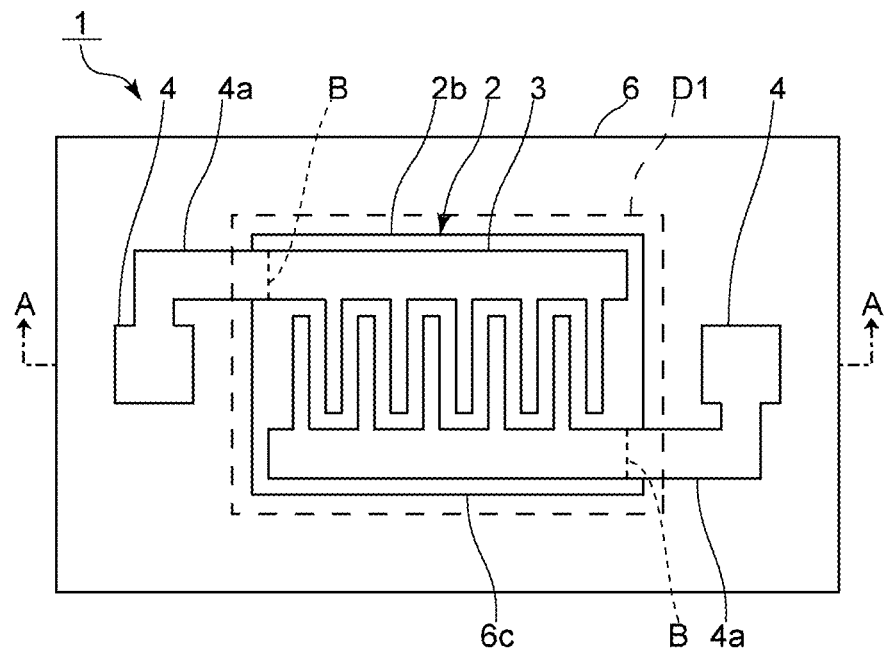
FIG. 1A is a plan view of an elastic wave device according to a first preferred embodiment of the present invention.
Figure 1B:
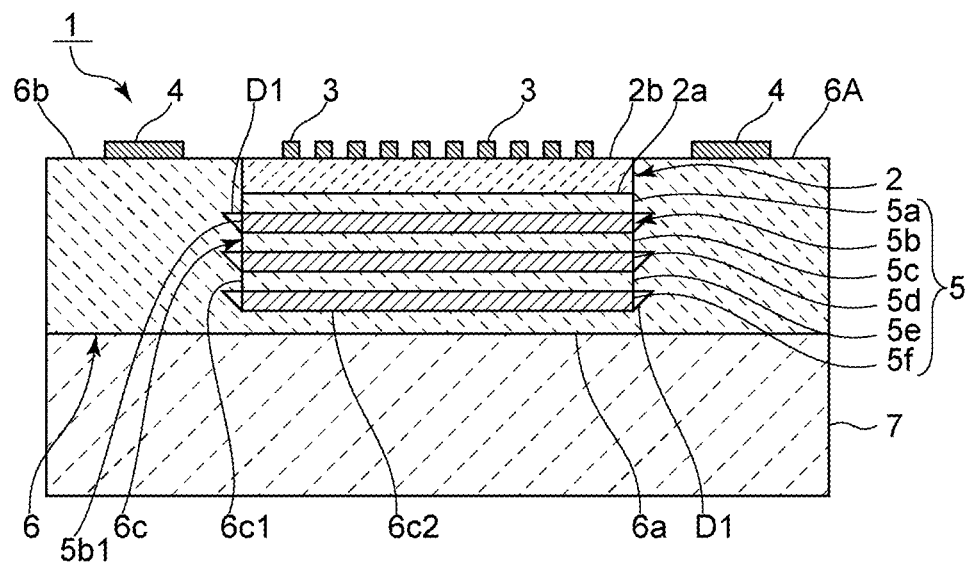
FIG. 1B is a sectional view of the elastic wave device taken along line A-A in FIG. 1A.

FIG. 1A is a plan view of an elastic wave device according to a first preferred embodiment of the present invention. FIG. 1B is a sectional view of the elastic wave device taken along line A-A in FIG. 1A.

An elastic wave device 1 includes a piezoelectric layer 2. As illustrated in FIG. 1B, the piezoelectric layer 2 includes a first main surface 2a and a second main surface 2b facing the first main surface 2a. The piezoelectric layer 2 is preferably made of piezoelectric single crystal, such as $LiNbO_3$ or $LiTaO_3$, for example. The material of the piezoelectric layer 2 is not particularly limited. For example, the piezoelectric layer 2 may be made of piezoelectric ceramics.

An interdigital transducer electrode 3 corresponding to an excitation electrode is disposed on the second main surface 2b of the piezoelectric layer 2. Elastic waves are excited when a voltage is applied to the interdigital transducer electrode 3. The elastic wave device 1 according to the present preferred embodiment uses Lamb waves as the elastic waves. Reflectors may be disposed on both sides of the interdigital transducer electrode 3 in the direction in which the elastic waves propagate.

The thickness of the piezoelectric layer 2 is not particularly limited but is preferably no less than about 100 nm and no more than about 1000 nm, for example. In the case where the thickness of the piezoelectric layer 2 is about 100 nm or more, the piezoelectric layer 2 is able to be unbreakable. In the case where the thickness of the piezoelectric layer 2 is about 1000 nm or less, the efficiency of excitation of the Lamb waves is able to be increased.

The interdigital transducer electrode 3 preferably includes a multilayer body of Ti and AlCu alloy composed of about 99% by weight of Al and about 1% by weight of Cu, for example. Ti is stacked on the second main surface 2b of the piezoelectric layer 2, and AlCu alloy is stacked on Ti. The interdigital transducer electrode 3 may include a single layer or a multilayer body. The material of the interdigital transducer electrode 3 is not particularly limited.

The thickness of the interdigital transducer electrode 3 according to the present preferred embodiment is preferably no less than about 10 nm and no more than about 1000 nm, for example. The thickness of the interdigital transducer electrode 3 is not particularly limited.

As illustrated in FIG. 1B, an acoustically reflective layer 5 is stacked on the first main surface 2a of the piezoelectric layer 2. The acoustically reflective layer 5 includes acoustic impedance layers. The acoustically reflective layer 5 includes low-acoustic-impedance layers 5a, 5c, and 5e and high-acoustic-impedance layers 5b, 5d, and 5f. The acoustic impedance of the high-acoustic-impedance layers 5b, 5d, and 5f is higher than the acoustic impedance of the low-acoustic-impedance layers 5a, 5c, and 5e.

The acoustically reflective layer 5 reflects, to the piezoelectric layer 2, elastic waves that propagate from the piezoelectric layer 2. This enables the energy of the elastic waves to be confined on the side of the piezoelectric layer 2 and enables an energy efficiency to be increased.

According to the present preferred embodiment, the acoustically reflective layer 5 preferably includes the three low-acoustic-impedance layers 5a, 5c, and 5e and the three high-acoustic-impedance layers 5b, 5d, and 5f. The number of the low-acoustic-impedance layers and the high-acoustic-impedance layers is not particularly limited.

As illustrated in FIGS. 1A and 1B, the acoustically reflective layer 5 overlaps the piezoelectric layer 2 in a plan view of the piezoelectric layer 2 from the side of the second main surface 2b. Thus, the acoustically reflective layer 5 overlaps at least the interdigital transducer electrode 3 in the plan view.

The low-acoustic-impedance layers 5a, 5c, and 5e are preferably made of a silicon oxide having a relatively low acoustic impedance, for example. Alternatively, the low-acoustic-impedance layers 5a, 5c, and 5e may be made of a material including a main component of a silicon oxide, a dielectric material other than a silicon oxide, or a metallic material, for example. The high-acoustic-impedance layers 5b, 5d, and 5f are preferably metal layers made of Pt, another dielectric material, or a metallic material that has a relatively high acoustic impedance, for example. The high-acoustic-impedance layers 5b, 5d, and 5f may be made of a metal such as Mo, Ta, or W other than Pt, for example. Alternatively, the high-acoustic-impedance layers 5b, 5d, and 5f may be layers made of ceramics, such as AlN or SiN or piezoelectric single crystal such as $LiNbO_3$ or $LiTaO_3$ instead of metal layers, for example. The materials of the low-acoustic-impedance layers 5a, 5c, and 5e and the high-acoustic-impedance layers 5b, 5d, and 5f are not particularly limited and may be appropriate materials having different acoustic impedances.

According to the present preferred embodiment, the thickness of the low-acoustic-impedance layers 5a, 5c, and 5e and the high-acoustic-impedance layers 5b, 5d, and 5f is preferably no less than about 100 nm and no more than about 1000 nm, for example. The thickness of the low-acoustic-impedance layers 5a, 5c, and 5e and the high-acoustic-impedance layers 5b, 5d, and 5f is not particularly limited.

A support layer 6 is structured so as to surround the piezoelectric layer 2 and the acoustically reflective layer 5 in a plan view of the piezoelectric layer 2 from the side of the second main surface 2b. More specifically, the support layer 6 includes a cavity 6c. The piezoelectric layer 2 and the acoustically reflective layer 5 are surrounded by the cavity 6c of the support layer 6. As illustrated in FIG. 1B, the cavity 6c of the support layer 6 includes a side surface portion 6c1 and a bottom portion 6c2. The piezoelectric layer 2 and the acoustically reflective layer 5 are in contact with the side surface portion 6c1. The acoustically reflective layer 5 is also in contact with the bottom portion 6c2. Thus, the piezoelectric layer 2 and the acoustically reflective layer 5 are supported by the support layer 6.

Gaps D1 are provided between the support layer 6 and the acoustically reflective layer 5. More specifically, the gaps D1 are provided outside the high-acoustic-impedance layers 5b, 5d, and 5f.

The support layer 6 is preferably made of a silicon oxide. According to the present preferred embodiment, the support layer and the low-acoustic-impedance layers 5a, 5c, and 5e in the acoustically reflective layer 5 are preferably made of the same material. The support layer 6 includes a first surface 6a opposite the acoustically reflective layer 5. The support layer 6 also includes a second surface 6b that faces the first surface 6a and from which the cavity 6c is provided.

The material of the support layer 6 is not particularly limited and may be made of an appropriate material other than a silicon oxide, for example, $Ta_2O_5$. The support layer 6 and the low-acoustic-impedance layers 5a, 5c, and 5e may be made of different materials. An acoustic impedance of the support layer may be higher than an acoustic impedance of the high-acoustic-impedance layer.

Electrode lands 4 are disposed on the second surface 6b of the support layer 6. As illustrated in FIG. 1A, the electrode lands 4 are electrically connected to the interdigital transducer electrode 3 with wiring lines 4a interposed therebetween. Dashed lines B indicate the boundaries between the interdigital transducer electrode 3 and the wiring lines 4a. A voltage is able to be applied to the interdigital transducer electrode 3 from the outside via the electrode lands 4 and the wiring lines 4a.

The electrode lands 4 and the wiring lines 4a preferably include a multilayer body of Ti and AlCu alloy composed of about 99% by weight of Al and about 1% by weight of Cu, for example, as in the case of the interdigital transducer electrode 3. Ti is stacked on the second surface 6b of the support layer 6, and AlCu alloy is stacked on Ti. The electrode lands 4 and the wiring lines 4a may include a single layer or a multilayer body. The material of the electrode lands 4 and the wiring lines 4a is not particularly limited. The electrode lands 4, the wiring lines 4a, and the interdigital transducer electrode 3 may be made of different materials. The thickness of the electrode lands 4 and the wiring lines 4a is not particularly limited and is preferably no less than about 100 nm and no more than about 2000 nm, for example, according to the present preferred embodiment.

As illustrated in FIG. 1B, a reinforcing substrate 7 is disposed on the first surface 6a of the support layer 6. This enables the strength of the elastic wave device 1 to be increased. The reinforcing substrate 7 is preferably made of Si, for example. The material of the reinforcing substrate 7 is not particularly limited. The reinforcing substrate 7 is not necessarily disposed thereon.

One of the unique features of an elastic wave device according to preferred embodiments of the present invention is that the acoustically reflective layer is surrounded by the support layer in a plan view of the piezoelectric layer 2 from the side of the second main surface 2b. This effectively prevents the characteristics of the elastic wave device from becoming poor or degraded when individual elastic wave devices are divided. More specifically, the acoustically reflective layer and the piezoelectric layer are unlikely to be separated from each other during cutting with a dicing machine to obtain the elastic wave device. The details will now be described together with a method for manufacturing elastic wave devices according to a preferred embodiment of the present invention.

Figure 3A:
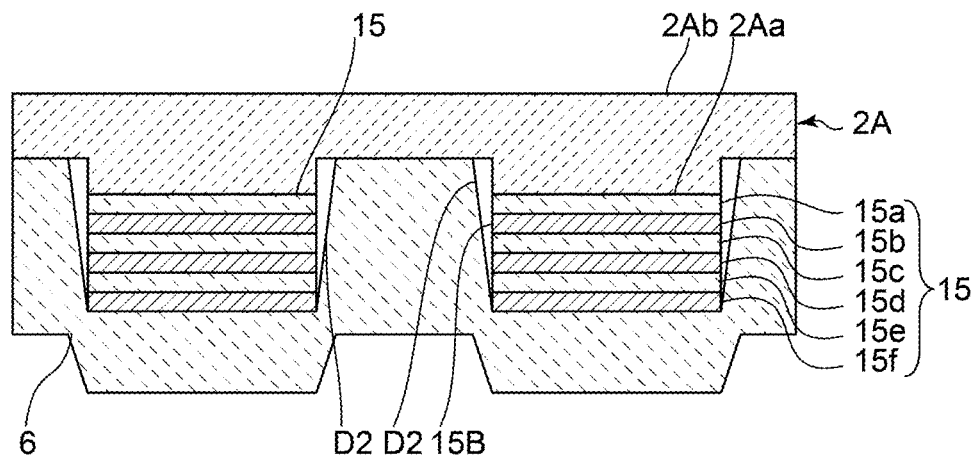
FIGS. 3A to 3C are front sectional views illustrating the method for manufacturing the elastic wave devices according to the second preferred embodiment of the present invention.
Figure 3B:
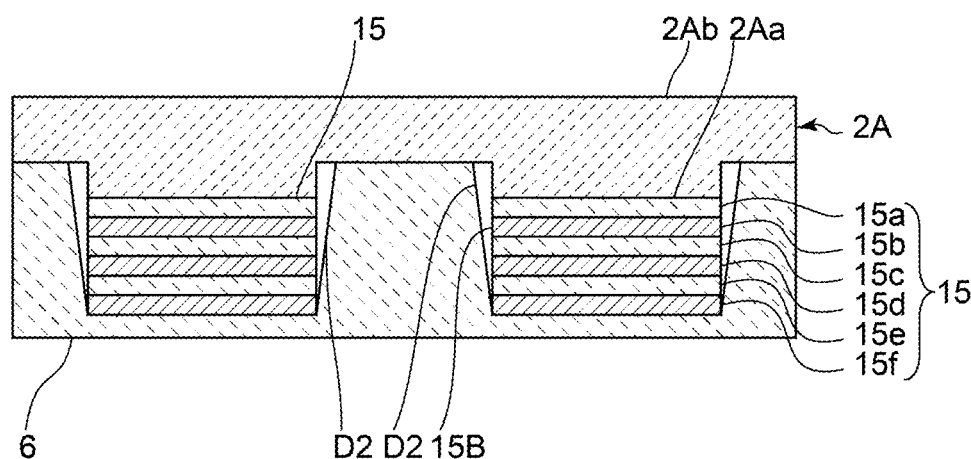
Figure 3C:
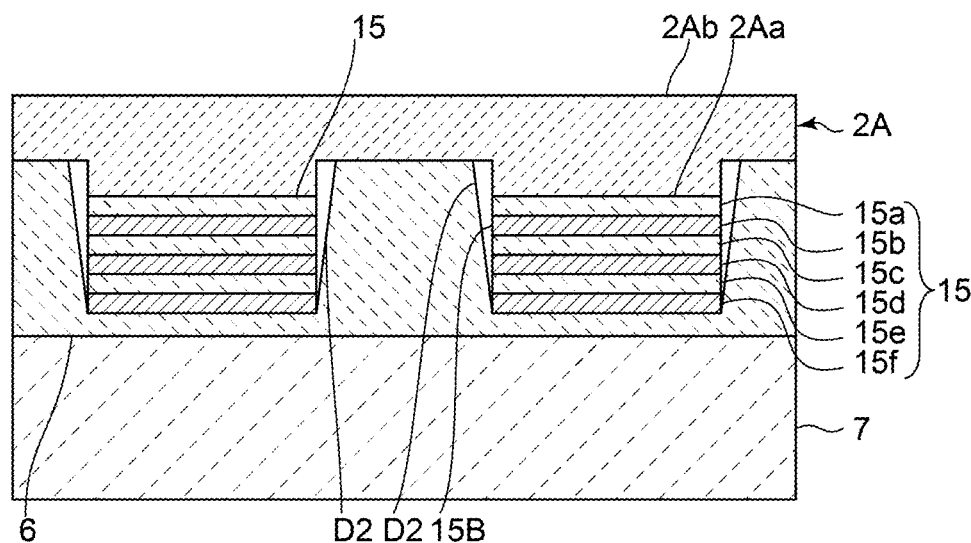
Figure 4A:
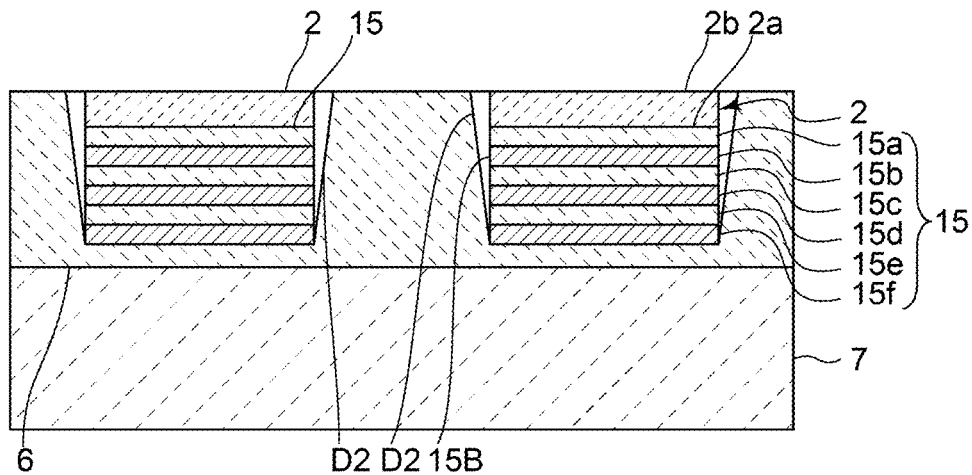
FIGS. 4A to 4C are front sectional views illustrating the method for manufacturing the elastic wave devices according to the second preferred embodiment of the present invention.
Figure 4B:
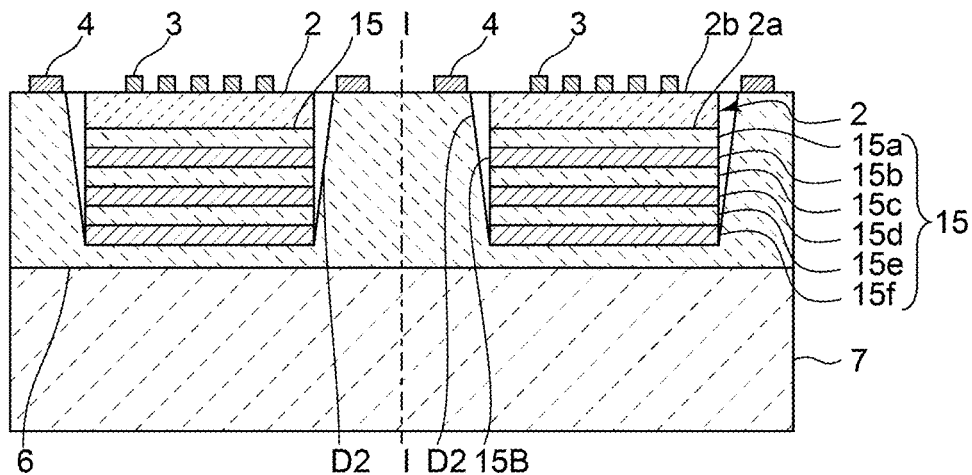
Figure 4C:
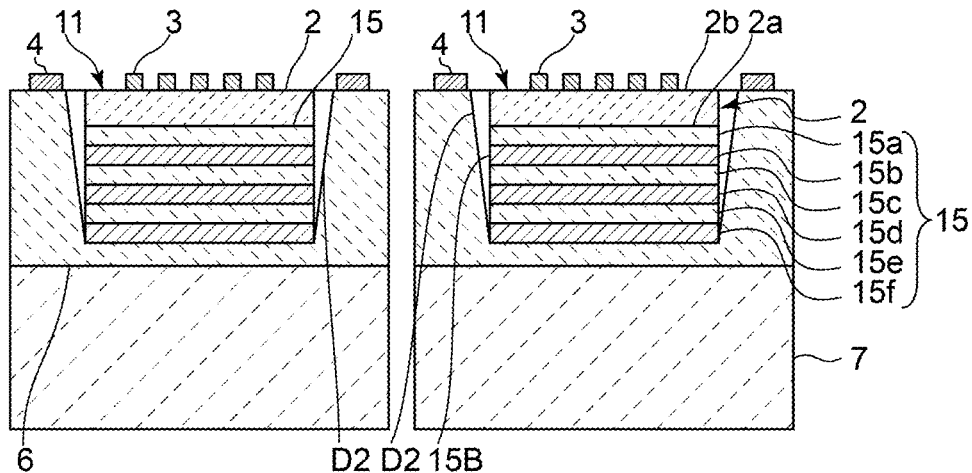

FIGS. 2A to 2D are front sectional views illustrating a non-limiting example of a method for manufacturing elastic wave devices according to a second preferred embodiment of the present invention. FIGS. 3A to 3C are front sectional views illustrating processes after processes illustrated in FIGS. 2A to 2D in the method for manufacturing the elastic wave devices according to the second preferred embodiment. FIGS. 4A to 4C are front sectional views illustrating processes after the processes illustrated in FIGS. 3A to 3C in the method for manufacturing the elastic wave devices according to the second preferred embodiment.

Figure 2A:
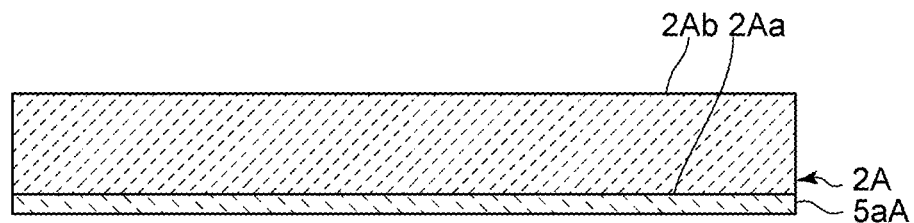
FIGS. 2A to 2D are front sectional views illustrating a method for manufacturing elastic wave devices according to a second preferred embodiment of the present invention.

As illustrated in FIG. 2A, a motherboard 2A is prepared. The motherboard 2A includes a first main surface 2Aa and a second main surface 2Ab facing the first main surface 2Aa. The motherboard 2A is made of a piezoelectric material. The motherboard 2A may preferably be made of piezoelectric single crystal, such as $LiNbO_3$ or $LiTaO_3$ or may be made of piezoelectric ceramics, for example. Individual piezoelectric layers are able to be obtained in a manner in which the motherboard 2A is divided into the individual piezoelectric layers.

Figure 2B:
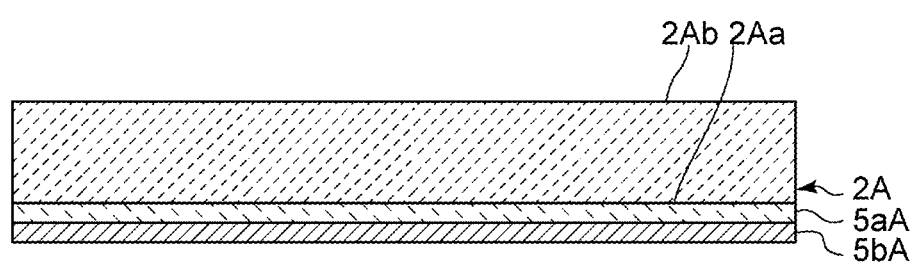
Figure 2C:
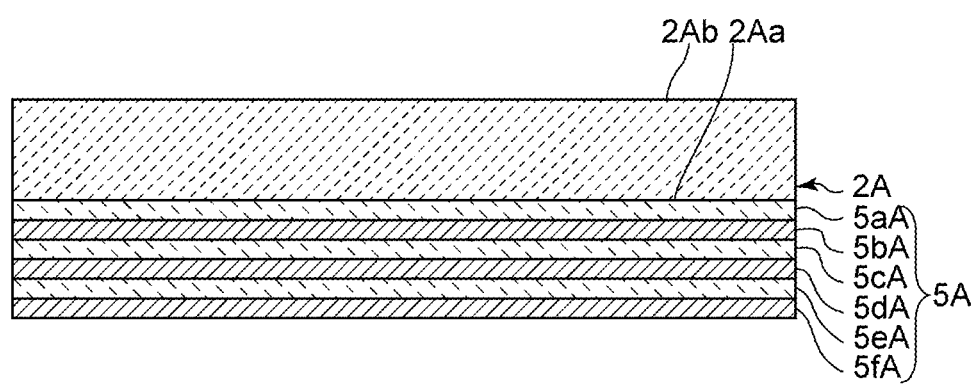

Subsequently, a low-acoustic-impedance layer 5aA is stacked on the first main surface 2Aa of the motherboard 2A. Subsequently, as illustrated in FIG. 2B, a high-acoustic-impedance layer 5bA is stacked on the low-acoustic-impedance layer 5aA. The low-acoustic-impedance layers 5aA, 5cA, and 5eA and the high-acoustic-impedance layers 5bA, 5dA, and 5fA illustrated in FIG. 2C are stacked in a manner in which the low-acoustic-impedance layers and the high-acoustic-impedance layers are alternately stacked. In this manner, an acoustically reflective layer 5A is able to be obtained. The low-acoustic-impedance layers 5aA, 5cA, and 5eA are preferably made of a silicon oxide, for example. The high-acoustic-impedance layers 5bA, 5dA, and 5fA are preferably made of a metal, such as Pt, for example. The low-acoustic-impedance layers 5aA, 5cA, and 5eA and the high-acoustic-impedance layers 5bA, 5dA, and 5fA may be stacked by, for example, a sputtering method or a vacuum deposition method.

Figure 2D:
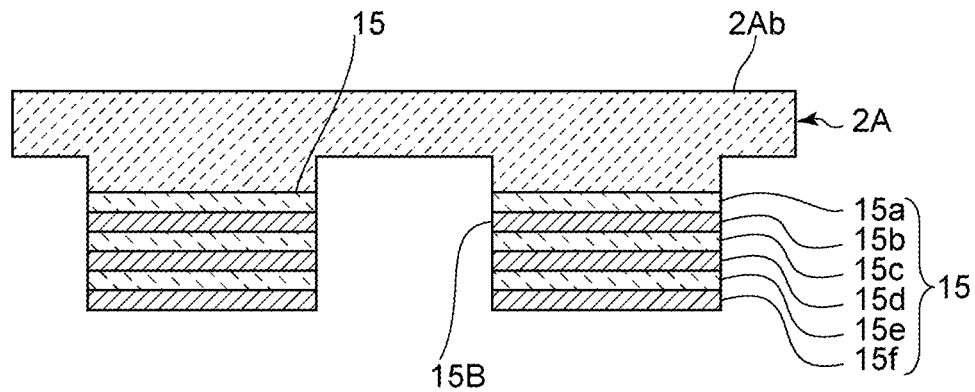

Subsequently, patterning is performed on the low-acoustic-impedance layers 5aA, 5cA, and 5eA and the high-acoustic-impedance layers 5bA, 5dA, and 5fA in the acoustically reflective layer 5A to provide low-acoustic-impedance layers 15a, 15c, and 15e and high-acoustic-impedance layers 15b, 15d, and 15f illustrated in FIG. 2D. In this manner, the acoustically reflective layer is divided into acoustically reflective layers 15. At the same time, patterning is performed on the motherboard 2A.

Patterning is able to be performed on the low-acoustic-impedance layers 5aA, 5cA, and 5eA, the high-acoustic-impedance layers 5bA, 5dA, and 5fA, and the motherboard 2A illustrated in FIG. 2C by using, for example, a photolithography method and a RIE (Reactive Ion Etching) method. A resist is first applied to the acoustically reflective layer 5A. Subsequently, patterning is performed on the resist by using a photolithography method. Subsequently, the resist is used as a mask to etch the low-acoustic-impedance layers 5aA, 5cA, and 5eA, the high-acoustic-impedance layers 5bA, 5dA, and 5fA, and the motherboard 2A by using a RIE method, for example. Subsequently, the resist is separated. In this manner, as illustrated in FIG. 2D, an outer circumferential portion 15B of each acoustically reflective layer 15 is able to be perpendicular or substantially perpendicular to the main surfaces of the acoustically reflective layer 15. This enables gaps D2 to be formed with certainty in a subsequent process.

Subsequently, as illustrated in FIG. 3A, the support layer 6 is formed on the motherboard 2A and the acoustically reflective layers 15. The support layer 6 is preferably made of a silicon oxide, for example. The support layer 6 may be formed by, for example, a sputtering method. At this time, the support layer 6 is able to be formed on the motherboard 2A in a state where the support layer 6 is not in contact with the outer circumferential portion 15B of at least two layers that are adjacent to each other in a stacking direction of each acoustically reflective layer 15. This enables the gaps D2 to be formed outside the at least two layers, which are adjacent to each other in the stacking direction, among the low-acoustic-impedance layers 15a, 15c, and 15e and the high-acoustic-impedance layers 15b, 15d, and 15f. Effects achieved in the case where the gaps D2 are formed will be described later.

Subsequently, as illustrated in FIG. 3B, the surface of the support layer 6 opposite the motherboard 2A is flattened by, for example, a CMP (Chemical Mechanical Polishing) method. Subsequently, as illustrated in FIG. 3C, the reinforcing substrate 7 is disposed on the surface of the support layer 6 opposite the motherboard 2A. A method of joining the reinforcing substrate 7 to the support layer 6 is not particularly limited. The reinforcing substrate 7 may be joined to the support layer 6 by using, for example, a resin adhesive. Alternatively, a surface activated bonding method, an atomic diffusion bonding method, or a metallic bonding method may be used.

Subsequently, the second main surface 2Ab of the motherboard 2A is flattened by, for example, polishing, and the thickness of the motherboard 2A is decreased. At this time, the motherboard 2A is polished until at least the support layer 6 is exposed. In this manner, as illustrated in FIG. 4A, the motherboard is able to be divided into individual piezoelectric layers 2. The thickness of each piezoelectric layer 2 may be adjusted to enable desired elastic waves to be excited in a manner in which the piezoelectric layer 2 is polished. A method of decreasing the thickness of the motherboard is not particularly limited. For example, a smart-cut method that implants ions into the motherboard to separate the motherboard may be used.

Subsequently, as illustrated in FIG. 4B, the interdigital transducer electrodes 3 are disposed on the second main surface 2b of the piezoelectric layers 2. The electrode lands are disposed on the support layer 6. Wiring lines, not illustrated in FIG. 4B, to connect the interdigital transducer electrodes 3 and the electrode lands 4 to each other are disposed on the piezoelectric layers 2 and the support layer 6. The interdigital transducer electrodes 3, the electrode lands 4, and the wiring lines are disposed thereon at the same time. The interdigital transducer electrodes 3, the electrode lands 4, and the wiring lines may be disposed by, for example, a deposition lift-off method, but this is not a particular limitation.

Subsequently, cutting is performed with a dicing machine along line I-I in FIG. 4B. As illustrated in FIG. 4C, this enables individual elastic wave devices 11 to be divided.

In the case where an interface between the piezoelectric layer and the acoustically reflective layer and interfaces between the acoustic impedance layers in the acoustically reflective layer intersect the line along which cutting is performed with the dicing machine, the piezoelectric layer and the acoustically reflective layer are likely to be separated from each other, and the layers in the acoustically reflective layer are likely to be separated from each other. For this reason, the characteristics of each elastic wave device become poor in some cases.

According to the present preferred embodiment, however, as illustrated in FIG. 4C, the support layer 6 is formed so as to surround the piezoelectric layers 2 and the acoustically reflective layers 15. That is, the piezoelectric layers 2 and the acoustically reflective layers 15 are not located on line I-I along which cutting is performed with the dicing machine in FIG. 4B. Thus, cutting is able to be performed with the dicing machine at a position of the support layer 6 at which the interfaces between the piezoelectric layers 2 and the acoustically reflective layers 15 and the interfaces between the low-acoustic-impedance layers 15a, 15c, and 15e and the high-acoustic-impedance layers 15b, 15d, and 15f are not located. Accordingly, each piezoelectric layer and the corresponding acoustically reflective layer are unlikely to be separated from each other, the layers in each acoustically reflective layer are unlikely to be separated from each other, and the incidence of poor characteristics of each elastic wave device is able to be effectively decreased.

In the case where a silicon oxide is used for the low-acoustic-impedance layers, adhesion between the piezoelectric layers and the corresponding low-acoustic-impedance layers decreases, and separation is more likely to occur. However, the structures according to preferred embodiments of the present invention eliminates such a concern.

In the case where the reinforcing substrate 7 is a Si substrate, adhesion to an interface with the support layer 6 made of a silicon oxide is strong, and separation along this interface is even more unlikely to occur.

Returning to FIGS. 1A and 1B, the effects of the elastic wave device 1 that are achieved in the case where the gaps D1 are provided will now be described.

Although elastic waves are reflected from the interface between the piezoelectric layer 2 and the acoustically reflective layer 5 to the piezoelectric layer 2, some of elastic waves propagate to the acoustically reflective layer 5. The elastic waves that propagate to the acoustically reflective layer 5 propagate to the support layer 6 from a contact portion between the acoustically reflective layer 5 and the support layer 6. According to the present preferred embodiment, the gaps D1 are provided between the support layer 6 and the acoustically reflective layer 5. More specifically, the gaps D1 are provided outside the high-acoustic-impedance layers 5b, 5d, and 5f in the acoustically reflective layer 5. For this reason, unnecessary elastic waves are canceled and are able to be prevented in a manner in which the unnecessary elastic waves are diffusely reflected by the gaps D1. Accordingly, the energy of the elastic waves in the main mode is able to be effectively confined on the side of the piezoelectric layer 2.

The gaps D2 are provided in each elastic wave device 11 illustrated in FIG. 4C. Thus, the energy of the elastic waves is able to be effectively confined on the side of the piezoelectric layer 2 as in the case of the elastic wave device 1.

Returning to FIG. 1B, the acoustically reflective layer 5 of the elastic wave device 1 includes the three low-acoustic-impedance layers 5a, 5c, and 5e and the three high-acoustic-impedance layers 5b, 5d, and 5f. That is, the acoustically reflective layer 5 includes five interfaces between the low-acoustic-impedance layers 5a, 5c, and 5e and the high-acoustic-impedance layers 5b, 5d, and 5f. Thus, the elastic waves that propagate from the piezoelectric layer 2 to the acoustically reflective layer 5 are able to be reflected from the five interfaces. Accordingly, the energy of the elastic waves is able to be effectively confined.

The acoustically reflective layer 5 is disposed so as to overlap at least the interdigital transducer electrode 3 in a plan view of the piezoelectric layer 2 from the side of the second main surface 2b. The energy of the elastic waves that propagate to the first main surface 2a of the piezoelectric layer 2 is particularly large at a position at which the acoustically reflective layer 5 overlaps the interdigital transducer electrode 3 in the plan view. Accordingly, the energy of the elastic waves is able be effectively confined by using the acoustically reflective layer 5.

The acoustically reflective layer 5 at the low-acoustic-impedance layer 5a is in contact with the support layer 6. The acoustically reflective layer 5 is also in contact with the bottom portion 6c2 of the cavity 6c of the support layer 6. This enables the acoustically reflective layer 5 to be fully supported by the support layer 6. A portion of the acoustically reflective layer 5 in contact with the bottom portion 6c2 corresponds to the surface of the acoustically reflective layer 5 opposite the surface in contact with the piezoelectric layer 2. That is, all of the interfaces between the low-acoustic-impedance layers 5a, 5c, and 5e and the high-acoustic-impedance layers 5b, 5d, and 5f in the acoustically reflective layer 5 are located between the piezoelectric layer 2 and the bottom portion 6c2. Thus, the acoustically reflective layer 5 is able to adequately provide a function of reflecting the elastic waves that propagate from the piezoelectric layer 2 even when the acoustically reflective layer 5 is in contact with the bottom portion 6c2. Accordingly, the energy of the elastic waves is able to be effectively confined, and the strength of the elastic wave device is able to be increased.

Figure 5:
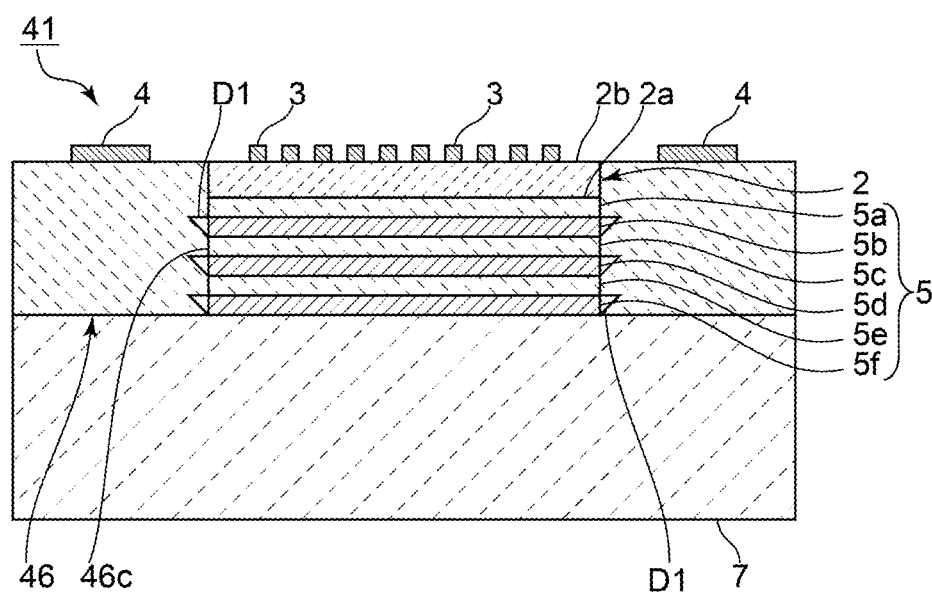
FIG. 5 is a front sectional view of an elastic wave device according to a first modification to the first preferred embodiment of the present invention.

As in the case of an elastic wave device 41 according to a first modification illustrated in FIG. 5, the cavity 46c of a support layer 46 may not include the bottom portion. In the elastic wave device 41, the acoustically reflective layer 5 is in contact with the reinforcing substrate 7. Also in this case, the energy of the elastic waves is able be effectively confined. When cutting is performed with a dicing machine, the piezoelectric layer and the acoustically reflective layer 5 are unlikely to be separated from each other, and the low-acoustic-impedance layers 5a, 5c, and 5e and the high-acoustic-impedance layers 5b, 5d, and 5f are unlikely to be separated from each other.

Returning to FIG. 1B, the low-acoustic-impedance layer 5a in the acoustically reflective layer 5 is in direct contact with the first main surface 2a of the piezoelectric layer 2. According to the present preferred embodiment, the piezoelectric layer 2 is preferably made of piezoelectric single crystal, such as $LiTaO_3$ or $LiNbO_3$, for example, and the low-acoustic-impedance layer 5a is preferably made of a silicon oxide, for example. For this reason, the frequency and temperature characteristics of the piezoelectric layer 2 are able to be effectively improved.

As illustrated in FIGS. 1A and 1B, the gaps D1 surround the acoustically reflective layer 5. The gaps D1 may be provided so as not to surround the acoustically reflective layer 5.

Figure 6A:
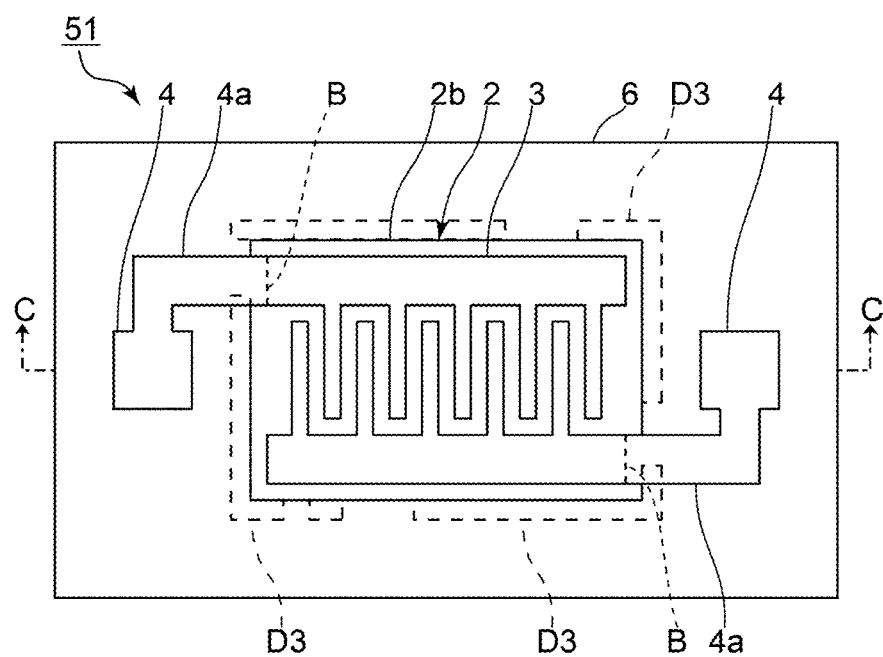
FIG. 6A is a plan view of an elastic wave device according to a second modification to the first preferred embodiment of the present invention.
Figure 6B:
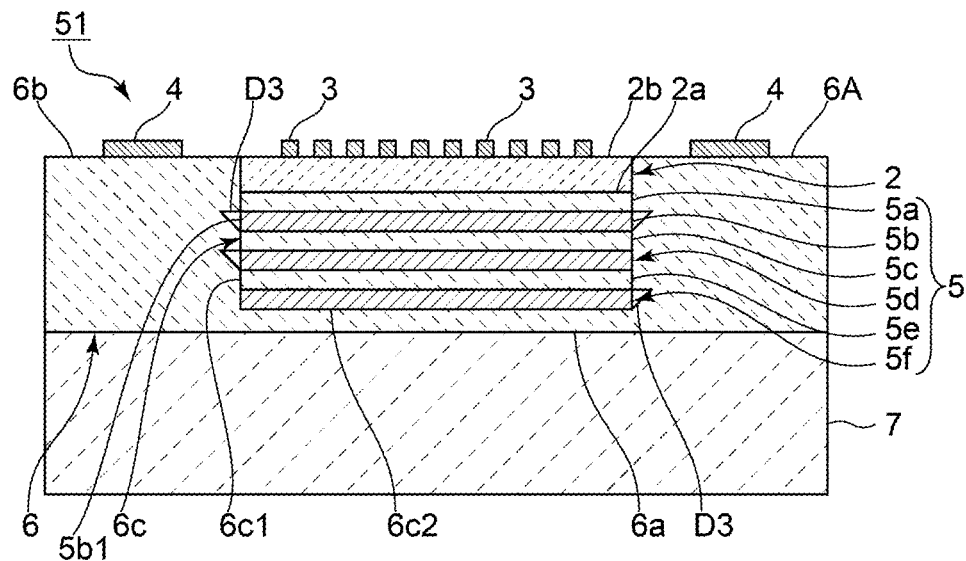
FIG. 6B is a sectional view of the elastic wave device taken along line C-C in FIG. 6A.

FIG. 6A is a plan view of an elastic wave device according to a second modification to the first preferred embodiment. FIG. 6B is a sectional view of the elastic wave device taken along line C-C in FIG. 6A.

As in the case of an elastic wave device 51 according to the second modification, gaps D3 may preferably be provided so as not to surround the acoustically reflective layer 5, provided that the gaps D3 are disposed outside the acoustically reflective layer 5. The gaps D3 disposed outside the layers in the acoustically reflective layer 5 may be structured so as not to overlap in a plan view of the piezoelectric layer 2 from the side of the second main surface 2b. Also in this case where the gaps D3 are provided, the energy of the elastic waves in the main mode is able to be effectively confined on the side of the piezoelectric layer 2.

Figure 7A:
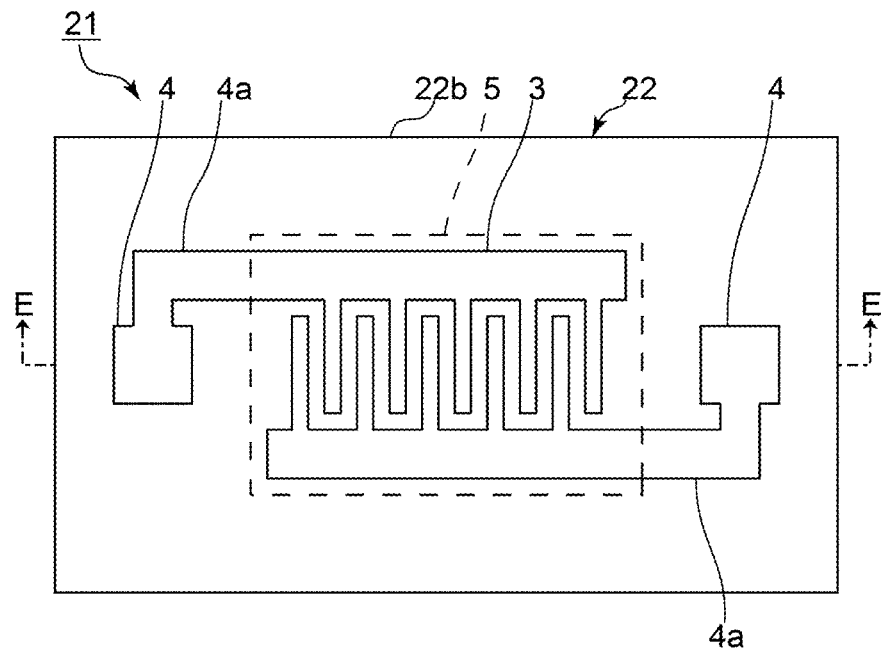
FIG. 7A is a plan view of an elastic wave device according to a third preferred embodiment of the present invention.
Figure 7B:
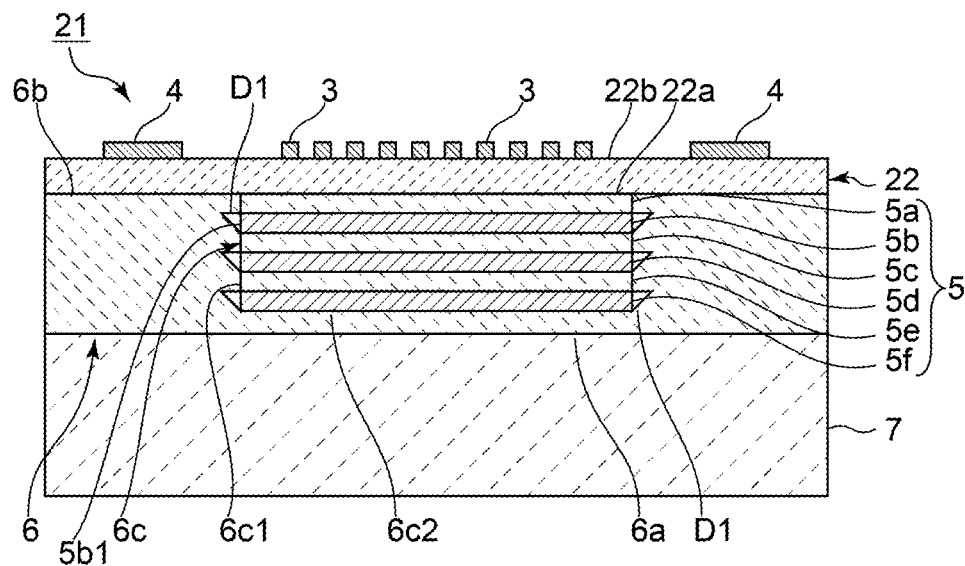
FIG. 7B is a sectional view of the elastic wave device taken along line E-E in FIG. 7A.

FIG. 7A is a plan view of an elastic wave device according to a third preferred embodiment of the present invention. FIG. 7B is a sectional view of the elastic wave device taken along line E-E in FIG. 7A.

As illustrated in FIG. 7B, the piezoelectric layer 22 of an elastic wave device 21 covers the cavity 6c of the support layer 6. The first main surface 22a of the piezoelectric layer 22 is in contact with the second surface 6b of the support layer 6. As illustrated in FIG. 7A, the electrode lands 4 and the wiring lines 4a are disposed on the second main surface 22b of the piezoelectric layer 22. The elastic wave device 21 has the same or similar structure as the elastic wave device 1 according to the first preferred embodiment except for the above structure.

When cutting is performed with a dicing machine to obtain the elastic wave device 21, the acoustically reflective layer 5 is not located on the line along which cutting is performed with the dicing machine as in the second preferred embodiment. Thus, the low-acoustic-impedance layers 5a, 5c, and 5e and the high-acoustic-impedance layers 5b, 5d, and 5f are unlikely to be separated from each other during cutting with the dicing machine. In addition, according to the third preferred embodiment, the gaps D1 are provided as in the first preferred embodiment, and the energy of the elastic waves in the main mode is able to be effectively confined.

A method of forming the gaps D1 will now be described with reference to FIGS. 8A to 8C and FIGS. 9A and 9B.

Figure 8A:
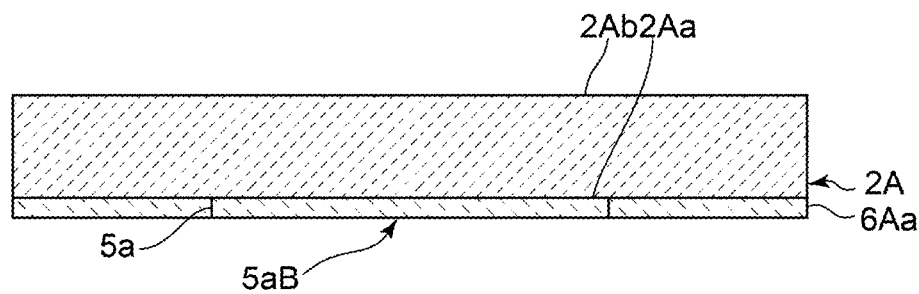
FIGS. 8A to 8C are front sectional views illustrating processes when an acoustically reflective layer and a support layer according to the third preferred embodiment of the present invention are formed.
Figure 8B:
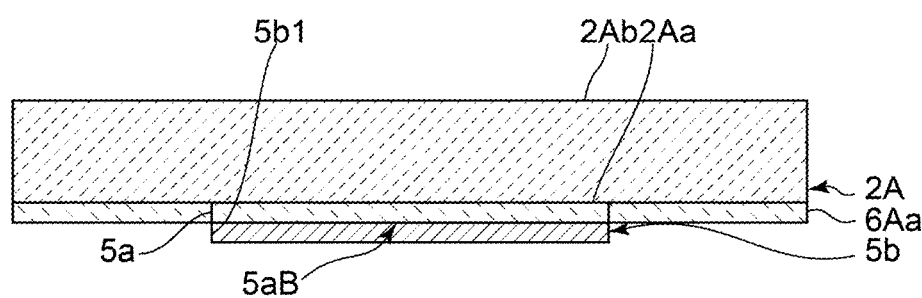
Figure 8C:
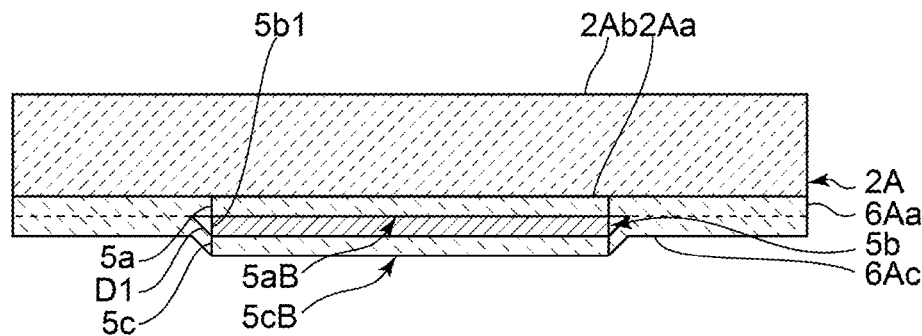
Figure 9A:
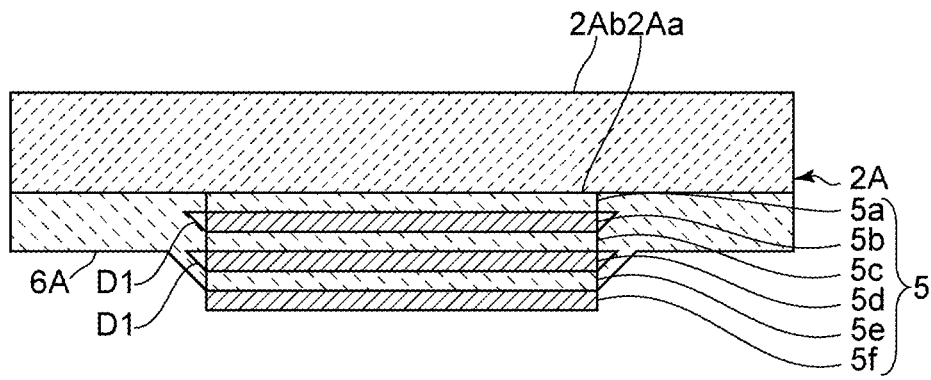
FIGS. 9A and 9B are front sectional views illustrating processes when the acoustically reflective layer and the support layer according to the third preferred embodiment of the present invention are formed.
Figure 9B:
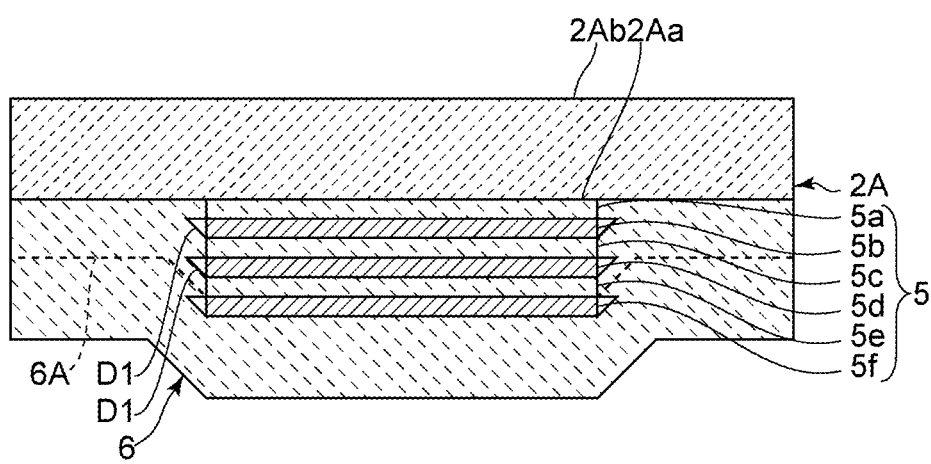

FIG. 8A to FIG. 8C are front sectional views illustrating processes when the acoustically reflective layer and the support layer according to the third preferred embodiment are formed. FIGS. 9A and 9B are front sectional views illustrating processes after the processes illustrated in FIGS. 8A to 8C when the acoustically reflective layer and the support layer according to the third preferred embodiment are formed.

As illustrated in FIG. 8A, the motherboard 2A is prepared. Subsequently, a low-acoustic-impedance layer 5aB is stacked on the first main surface 2Aa of the motherboard 2A. The low-acoustic-impedance layer 5aB includes the low-acoustic-impedance layer 5a and a support-layer forming portion 6Aa that are preferably made of the same material. The low-acoustic-impedance layer 5a becomes the low-acoustic-impedance layer 5a in the acoustically reflective layer 5 of the elastic wave device 21 illustrated in FIG. 7B. The support-layer forming portion 6Aa becomes a portion of the support layer 6. The low-acoustic-impedance layer 5aB may be formed by, for example, a sputtering method.

Subsequently, as illustrated in FIG. 8B, the high-acoustic-impedance layer 5b, which is preferably a metal layer, is stacked on the low-acoustic-impedance layer 5a while performing patterning. The high-acoustic-impedance layer 5b may be formed by, for example, a deposition lift-off method. This enables an edge portion 5b1 of the high-acoustic-impedance layer 5b to be perpendicular or substantially perpendicular to the main surfaces of the acoustically reflective layer 5.

Subsequently, as illustrated in FIG. 8C, a low-acoustic-impedance layer 5cB is stacked on the high-acoustic-impedance layer 5b and the support-layer forming portion 6Aa. At this time, the low-acoustic-impedance layer 5cB is stacked so as to cover the high-acoustic-impedance layer 5b including the edge portion 5b1. This enables the low-acoustic-impedance layer 5cB to be stacked on the high-acoustic-impedance layer 5b and the support-layer forming portion 6Aa in a state where the low-acoustic-impedance layer 5cB is not in contact with the edge portion 5b1. In this manner, the gap D1 is able to be readily formed outside the high-acoustic-impedance layer 5b.

The low-acoustic-impedance layer 5cB includes the low-acoustic-impedance layer 5c and a support-layer forming portion 6Ac. The low-acoustic-impedance layer 5c becomes the low-acoustic-impedance layer 5c in the acoustically reflective layer 5 illustrated in FIG. 7B. The support-layer forming portion 6Ac becomes a portion of the support layer 6.

Subsequently, as illustrated in FIG. 9A, the low-acoustic-impedance layers, the high-acoustic-impedance layers, and the support-layer forming portions are stacked in the same manner as illustrated in FIGS. 8B and 8C. In this manner, the low-acoustic-impedance layers 5a, 5c, and 5e, the high-acoustic-impedance layers 5b, 5d, and 5f, and a support-layer forming portion 6A are obtained. According to the third preferred embodiment, the support-layer forming portion 6A includes a multilayer body of three support-layer forming portions stacked when the low-acoustic-impedance layers 5a, 5c, and 5e are obtained.

Subsequently, as illustrated in FIG. 9B, the support layer 6 is formed. In this manner, the gaps D1 are able to be formed outside the high-acoustic-impedance layers 5b, 5d, and 5f. The above method is described as an example, and the method of forming the gaps D1 is not limited to the above method.

The elastic wave devices 1 and 21 according to the first and third preferred embodiments and the elastic wave devices 11 obtained by the manufacturing method according to the second preferred embodiment preferably use Lamb waves, for example. The present invention may also be applied to an elastic wave device that uses bulk waves.

Figure 10:
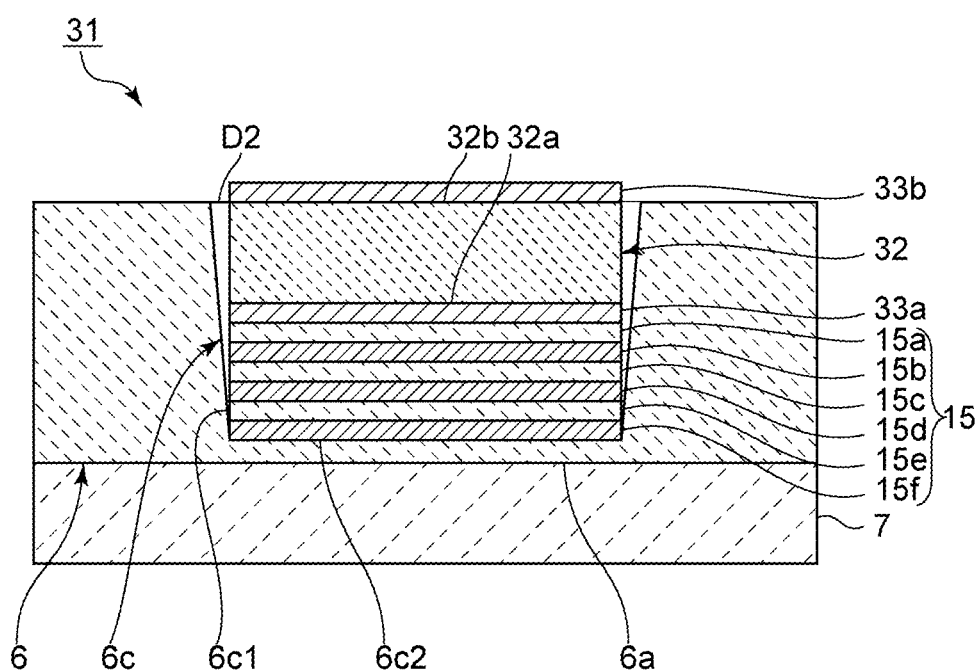
FIG. 10 is a front sectional view of an elastic wave device according to a fourth preferred embodiment of the present invention.

FIG. 10 is a front sectional view of an elastic wave device according to a fourth preferred embodiment of the present invention.

An elastic wave device 31 uses bulk waves. A first excitation electrode 33a is disposed on the first main surface 32a of a piezoelectric layer 32 of the elastic wave device 31. A second excitation electrode 33b is disposed on the second main surface 32b of the piezoelectric layer 32. Bulk waves are excited when a voltage is applied to the first and second excitation electrodes 33a and 33b.

The acoustically reflective layer 15 is stacked on the first excitation electrode 33a. The support layer 6 preferably surrounds the piezoelectric layer 32, the first excitation electrode 33a, and the acoustically reflective layer 15. The gaps D2 are provided between the acoustically reflective layer 15 and the support layer 6. The gaps D2 may not be provided.

Also in this case, the piezoelectric layer 2 and the acoustically reflective layer 15 are unlikely to be separated from each other, and the layers in the acoustically reflective layer 15 are unlikely to be separated from each other during a process of cutting with a dicing machine.

Figure 11:
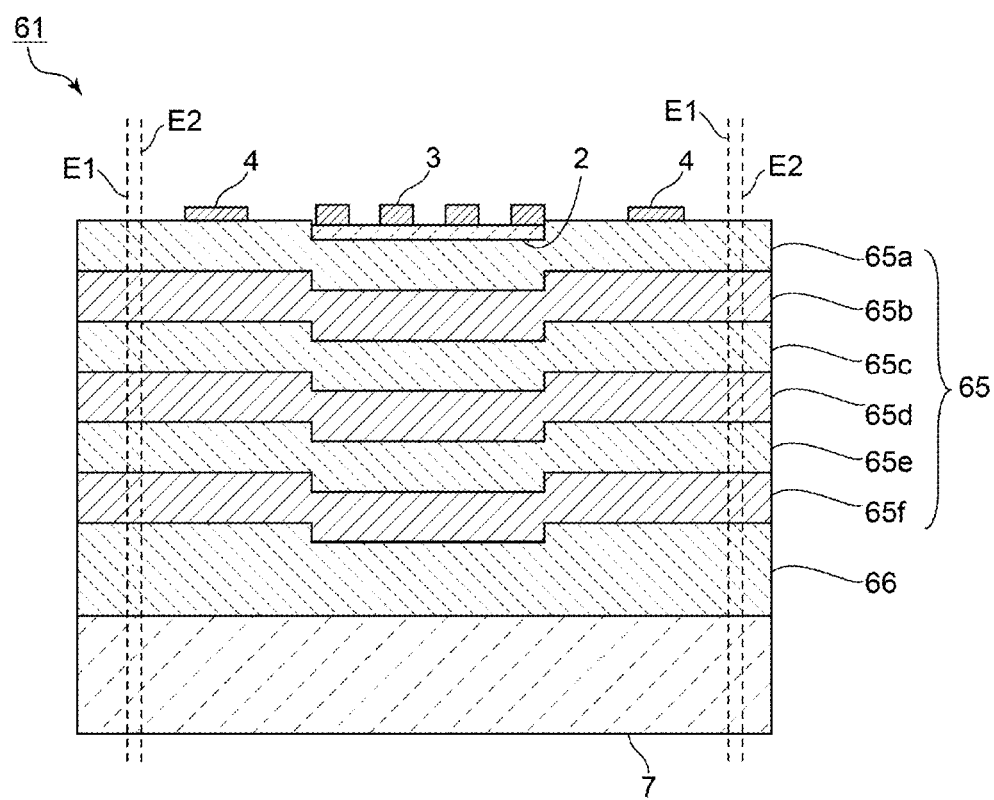
FIG. 11 is a front sectional view of an elastic wave device according to a fifth preferred embodiment of the present invention before cutting with a dicing machine.

FIG. 11 is a front sectional view of an elastic wave device 61 according to a fifth preferred embodiment of the present invention before cutting with a dicing machine. The elastic wave device 61 includes a piezoelectric layer 2 made of a piezoelectric film, and the interdigital transducer electrode 3 disposed on a surface of the piezoelectric layer 2. The piezoelectric layer 2 is provided on an acoustically reflective layer 65. The structure of the acoustically reflective layer 65 is such that low-acoustic-impedance layers 65a, 65c, and 65e and high-acoustic-impedance layers 65b, 65d, and 65f are alternately stacked in the stacking direction. The piezoelectric layer 2 is provided on the low-acoustic-impedance layer 65a. The acoustically reflective layer 65 is stacked on the reinforcing substrate 7.

A method for manufacturing the elastic wave device 61 will be described with reference to FIGS. 12A to 12C and FIGS. 13A to 13C.

Patterning is performed on a surface of the motherboard 2A made of a piezoelectric material to form a protrusion 2A1 that ultimately becomes the piezoelectric layer 2.

Figure 12A:
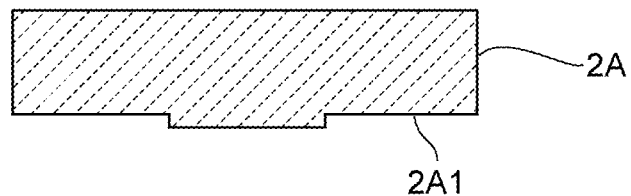
FIGS. 12A to 12C are front sectional views illustrating processes when the elastic wave device according to the fifth preferred embodiment of the present invention is manufactured.
Figure 12B:
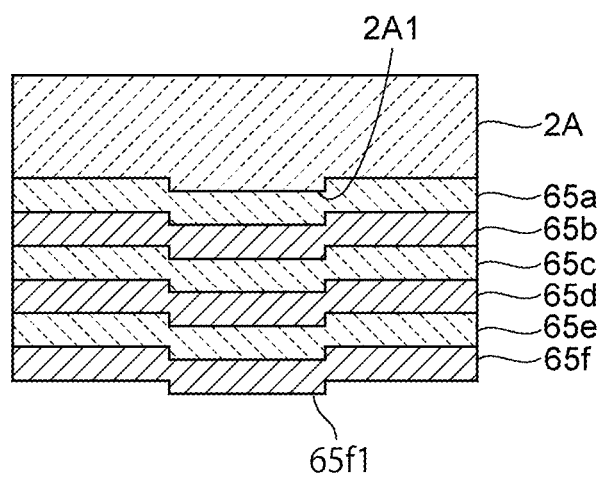

Subsequently, as illustrated in FIG. 12B, the low-acoustic-impedance layer 65a, the high-acoustic-impedance layer 65b, the low-acoustic-impedance layer 65c, the high-acoustic-impedance layer 65d, the low-acoustic-impedance layer 65e, and the high-acoustic-impedance layer 65f are stacked on the motherboard 2A on the side on which the protrusion 2A1 is formed. In this manner, the acoustically reflective layer 65 is formed. In this case, the protrusion 2A1 is formed, and a protrusion 65/1 is formed on the surface of the acoustically reflective layer 65 opposite the motherboard 2A. When this acoustic multilayer film is stacked, a process of removing the protrusion may be appropriately performed to remove the protrusion for flattening. Flattening is preferably performed by, for example, polishing.

Figure 12C:
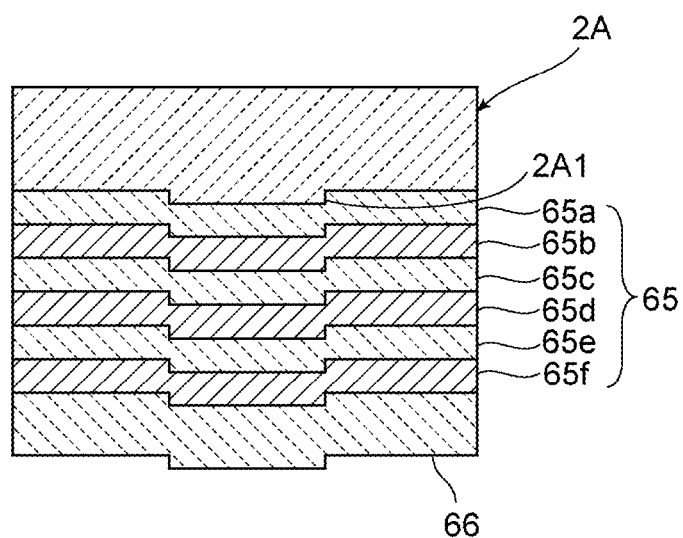

Subsequently, as illustrated in FIG. 12C, a flattening film 66 is stacked. The flattening film 66 may be made of the same material as the low-acoustic-impedance layer 65a. However, a $SiO_2$ film, for example, is preferably used to facilitate flattening.

Figure 13A:
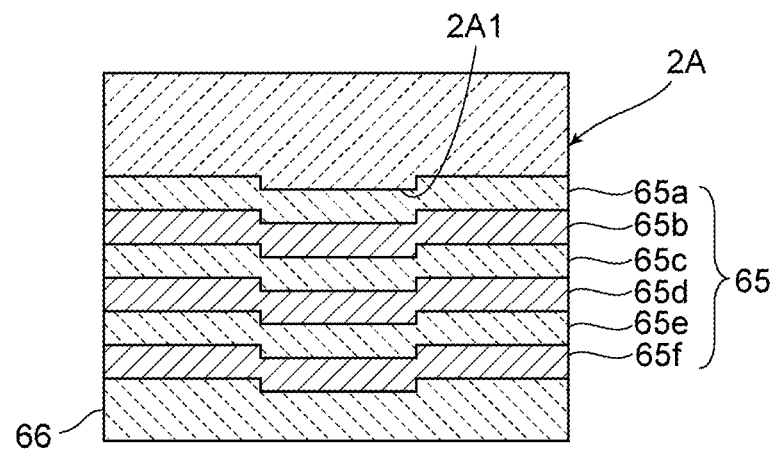
FIGS. 13A to 13C are front sectional views illustrating processes when the elastic wave device according to the fifth preferred embodiment of the present invention is manufactured.

Subsequently, as illustrated in FIG. 13A, the lower surface of the flattening film 66 is polished and flattened.

Figure 13B:
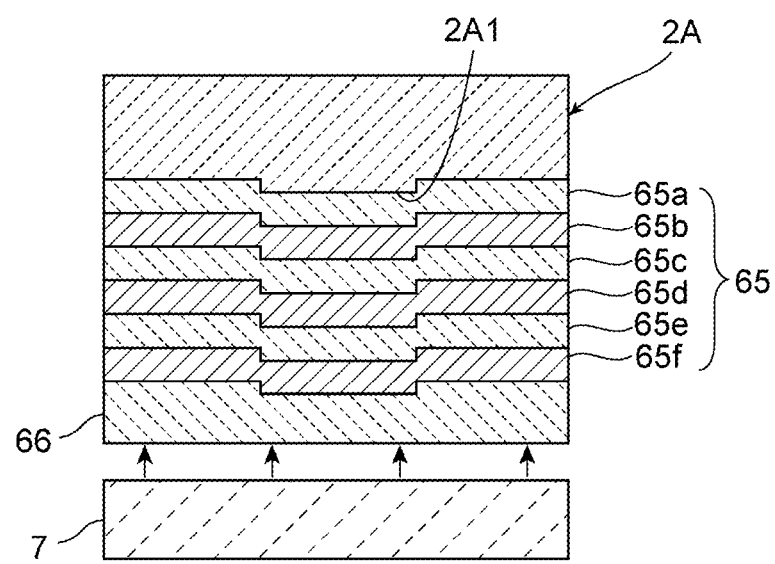

Subsequently, as illustrated in FIG. 13B, the reinforcing substrate 7 is joined to the flattening film 66.

Figure 13C:
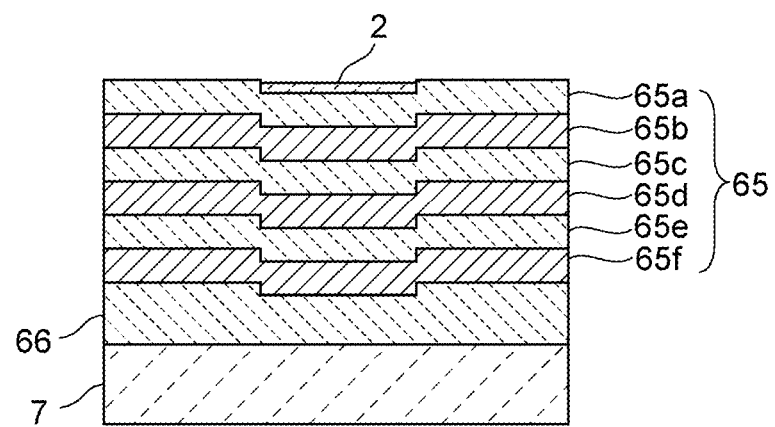

Subsequently, as illustrated in FIG. 13C, the motherboard 2A is polished to form the piezoelectric layer 2. A portion of the piezoelectric substrate above the protrusion 2A1 is removed. In this manner, the piezoelectric layer 2 is formed.

Subsequently, the interdigital transducer electrode 3 and the electrode lands 4 are disposed on the piezoelectric layer (see FIG. 11).

In the case of the elastic wave device 61, the above manufacturing processes are performed on a motherboard structure. Subsequently, cutting is performed with a dicing machine such that portions surrounded by dashed lines E1 and dashed lines E2 in FIG. 11 are removed. In this way, the individual elastic wave device 61 is obtained.

In the elastic wave device 61, the piezoelectric layer 2 is located inside the portions to be cut with the dicing machine denoted by the dashed lines E1 and E2. Accordingly, the piezoelectric layer 2 and the acoustically reflective layer 65 are unlikely to be separated from each other during a process of cutting with the dicing machine. In addition, the piezoelectric layer 2 is unlikely to crack.

Furthermore, the elastic wave device 61 does not require a process of patterning of the acoustically reflective layer 65, and the number of the manufacturing processes and cost are able to be decreased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric layer including a first main surface and a second main surface facing the first main surface;
   an acoustically reflective layer on the first main surface of the piezoelectric layer;
   an excitation electrode on the second main surface of the piezoelectric layer; and
   a support layer; wherein
   the acoustically reflective layer overlaps at least the excitation electrode in a plan view of the piezoelectric layer from a second main surface side;
   the support layer surrounds the acoustically reflective layer in the plan view of the piezoelectric layer from the second main surface side such that, in the plan view of the piezoelectric layer from the second main surface side, an outer periphery of the acoustically reflective layer is inside of an outer periphery of the support layer; and
   an acoustic impedance of the support layer is different from an acoustic impedance of the acoustically reflective layer.

2. The elastic wave device according to claim 1, wherein the first main surface of the piezoelectric layer is in contact with an upper surface of the support layer.

3. The elastic wave device according to claim 1, wherein the acoustically reflective layer includes a plurality of acoustic impedance layers stacked on one another; and
   the plurality of acoustic impedance layers include at least one low-acoustic-impedance layer and at least one high-acoustic-impedance layer with an acoustic impedance higher than an acoustic impedance of the at least one low-acoustic-impedance layer.

4. The elastic wave device according to claim 3, wherein the acoustic impedance of the support layer is higher than the acoustic impedance of the at least one high-acoustic-impedance layer.

5. The elastic wave device according to claim 1, wherein the support layer surrounds the acoustically reflective layer in the plan view of the piezoelectric layer from the second main surface side.

6. The elastic wave device according to claim 1, wherein the at least one low-acoustic-impedance layer includes a silicon oxide.

7. The elastic wave device according to claim 1, wherein the at least one high-acoustic-impedance layer is made of metal.

8. The elastic wave device according to claim 7, wherein the metal includes at least one of Pt, Mo, Ta, or W.

9. The elastic wave device according to claim 7, wherein the metal is Pt.

10. The elastic wave device according to claim 1, wherein the support layer is made of $Ta_2O_5$.

11. The elastic wave device according to claim 1, wherein the excitation electrode is an interdigital transducer electrode, and the interdigital transducer electrode is disposed on the second main surface of the piezoelectric layer.

12. The elastic wave device according to claim 11, wherein
the interdigital transducer electrode includes a plurality of first electrode fingers connected to a first busbar, and a plurality of second electrode fingers connected to a second busbar; and
a thickness of the piezoelectric layer is less than about $1\lambda$, where $\lambda$ is a wavelength defined by a pitch of the first and second electrode fingers.

13. The elastic wave device according to claim 1, wherein the excitation electrode includes first and second excitation electrodes, the first excitation electrode is disposed on the first main surface of the piezoelectric layer, and the second excitation electrode is disposed on the second main surface of the piezoelectric layer.

14. The elastic wave device according to claim 13, wherein a thickness of the piezoelectric layer is less than about $1\lambda$, where $\lambda$ is a wavelength defined by a pitch of the first and second excitation electrodes.

15. The elastic wave device according to claim 1, further comprising:
a reinforcing substrate disposed on the support layer opposite to the piezoelectric layer.

16. The elastic wave device according to claim 15, wherein the reinforcing substrate includes Si.

* * * * *